United States Patent
Darrow et al.

(10) Patent No.: US 8,939,796 B2
(45) Date of Patent: Jan. 27, 2015

(54) SURGE PROTECTOR COMPONENTS HAVING A PLURALITY OF SPARK GAP MEMBERS BETWEEN A CENTRAL CONDUCTOR AND AN OUTER HOUSING

(71) Applicant: CommScope, Inc. of North Carolina, Hickory, NC (US)

(72) Inventors: Robert E. Darrow, Hickory, NC (US); Kenneth Steven Wood, Elmira, NY (US); Robert R. Riggsby, Hickory, NC (US); Shi Man Li, Hickory, NC (US); Mark Vogel, Statesville, NC (US)

(73) Assignee: CommScope, Inc. of North Carolina, Hickory, NC (US)

( * ) Notice: Subject to any disclaimer, the term of this patent is extended or adjusted under 35 U.S.C. 154(b) by 98 days.

(21) Appl. No.: 13/649,734

(22) Filed: Oct. 11, 2012

(65) Prior Publication Data

US 2013/0090010 A1    Apr. 11, 2013

Related U.S. Application Data

(60) Provisional application No. 61/545,759, filed on Oct. 11, 2011.

(51) Int. Cl.
| H01R 13/66 | (2006.01) |
| H02H 9/06 | (2006.01) |
| H01R 24/48 | (2011.01) |
| H01T 4/02 | (2006.01) |
| H01T 4/08 | (2006.01) |
| H01T 4/10 | (2006.01) |
| H05K 1/02 | (2006.01) |

(52) U.S. Cl.
CPC ............... *H02H 9/06* (2013.01); *H01R 13/66* (2013.01); *H01R 24/48* (2013.01); *H01T 4/02* (2013.01); *H01T 4/08* (2013.01); *H01T 4/10* (2013.01); *H05K 1/0257* (2013.01); *H05K 1/026* (2013.01)
USPC ................................................... 439/620.03

(58) Field of Classification Search
USPC ............... 439/620.03; 361/118, 181, 119
See application file for complete search history.

(56) References Cited

U.S. PATENT DOCUMENTS

| | | | | |
|---|---|---|---|---|
| 3,323,083 | A * | 5/1967 | Ziegler, Jr. | 333/260 |
| 4,554,608 | A * | 11/1985 | Block | 361/119 |
| 4,727,350 | A * | 2/1988 | Ohkubo | 338/21 |
| 5,278,720 | A * | 1/1994 | Bird | 361/119 |
| 5,442,330 | A * | 8/1995 | Fuller et al. | 333/204 |
| 5,508,873 | A * | 4/1996 | Knapp et al. | 361/119 |
| 6,236,551 | B1 * | 5/2001 | Jones et al. | 361/119 |
| 6,243,247 | B1 * | 6/2001 | Akdag et al. | 361/111 |
| 6,450,836 | B1 * | 9/2002 | Youtsey | 439/620.03 |
| 6,492,894 | B2 * | 12/2002 | Bone et al. | 337/32 |
| 6,644,994 | B1 * | 11/2003 | Lee | 439/181 |
| 6,785,110 | B2 * | 8/2004 | Bartel et al. | 361/119 |
| 6,949,989 | B2 * | 9/2005 | Panetta et al. | 333/185 |
| 7,092,230 | B2 * | 8/2006 | Inauen | 361/119 |
| 7,719,815 | B2 * | 5/2010 | Shato et al. | 361/120 |
| 7,944,670 | B2 * | 5/2011 | Jones et al. | 361/119 |

(Continued)

*Primary Examiner* — Alexander Gilman
(74) *Attorney, Agent, or Firm* — Myers Bigel Sibley & Sajovec, PA (57) ABSTRACT

A coaxial connector includes a surge protection component including a plurality of elongated members, a body portion that is configured to receive the surge protection component such that the elongated members extend along an outer surface thereof, and a center conductor disposed inside the body portion and spaced apart from the surge protection component so as to create a gap therebetween.

7 Claims, 11 Drawing Sheets

(56) References Cited

U.S. PATENT DOCUMENTS

| | | | |
|---|---|---|---|
| 8,179,656 B2* | 5/2012 | Jones et al. | 361/119 |
| 8,228,656 B2* | 7/2012 | Kauffman | 361/118 |
| 8,582,273 B2* | 11/2013 | Murata et al. | 361/118 |
| 2005/0036262 A1* | 2/2005 | Siebenthall et al. | 361/118 |
| 2006/0198075 A1* | 9/2006 | Kato | 361/118 |
| 2008/0318088 A1* | 12/2008 | Cruise et al. | 429/7 |
| 2009/0109584 A1* | 4/2009 | Jones et al. | 361/56 |
| 2009/0284888 A1* | 11/2009 | Bartel et al. | 361/118 |
| 2011/0141646 A1* | 6/2011 | Jones et al. | 361/119 |

\* cited by examiner

FIG. 15

SURGE PROTECTOR COMPONENTS HAVING A PLURALITY OF SPARK GAP MEMBERS BETWEEN A CENTRAL CONDUCTOR AND AN OUTER HOUSING

CROSS REFERENCE TO RELATED APPLICATION

This application claims priority to U.S. Provisional Patent Application No. 61/545,759, filed Oct. 11, 2011, the disclosure of which is hereby incorporated herein by reference as if set forth in its entirety.

FIELD OF THE INVENTION

The present invention relates generally to connectors for communications cables and, more particularly, to connectors for coaxial cables.

BACKGROUND

Figure 1A:
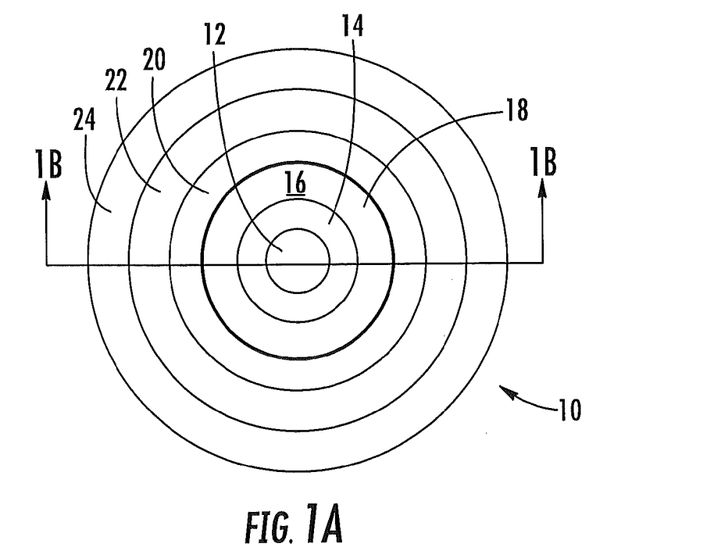
FIGS. 1A and 1B are, respectively, a schematic transverse cross-sectional view and a schematic longitudinal cross-sectional view of a conventional coaxial cable.
Figure 1B:
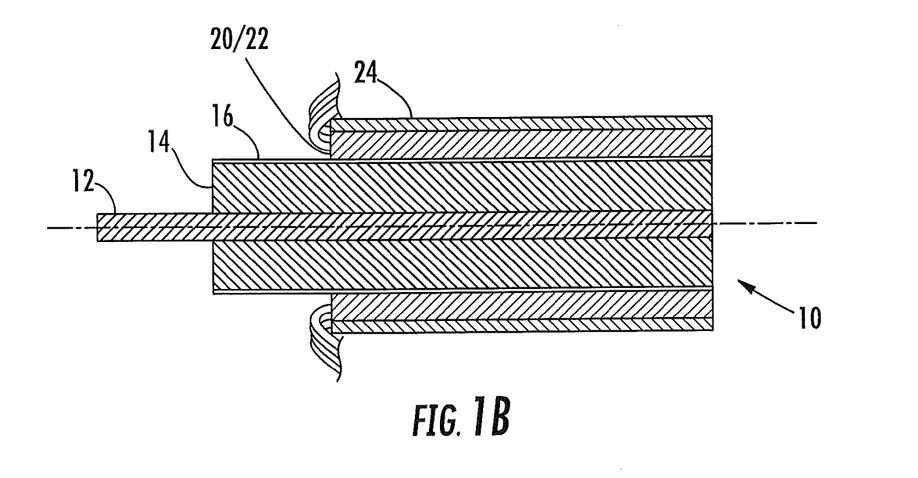

Coaxial cables are a well-known type of electrical cable that may be used to carry information signals, such as television or data signals. Coaxial cables are widely used in cable television networks and to provide broadband Internet connectivity. FIGS. 1A and 1B are, respectively, a schematic transverse cross-sectional view and a schematic longitudinal cross-sectional view of a conventional coaxial cable 10 (FIG. 1B is taken along the cross section 1B-1B shown in FIG. 1A). As shown in FIGS. 1A and 1B, the coaxial cable 10 has a central conductor 12 that is surrounded by a dielectric 14. A tape 16 may be bonded to the dielectric 14. The central conductor 12, dielectric 14, and tape 16 comprise the core 18 of the cable. Electrical shielding wires 20 and, optionally, electrical shielding tape(s) 22 surround the cable core 18. Finally, a cable jacket 24 surrounds the electrical shielding wires 20 and electrical shielding tape(s) 22. As shown in FIG. 1B, the dielectric 14, tape 16, electrical shielding wires 20, electrical shielding tape 22, and cable jacket 24 may be cut, and the electrical shielding wires 20, electrical shielding tape 22 and cable jacket 24 may be folded back to prepare the coaxial cable 10 for attachment to certain types of coaxial connectors.

Typically, each end of a coaxial cable is terminated with either a male coaxial connector or a female coaxial connector port. Two of the most common types of coaxial connectors are "F-style" coaxial connectors and "bayonet navy connectors", which are typically referred to as "BNC-style" coaxial connectors. Both F-style and BNC-style coaxial connectors include a male connector and a corresponding female connector port that is configured to mate with the male connector.

BNC-style coaxial connectors are often used in indoor applications. Typically, a male BNC-style connector includes a center pin that acts as a center contact. This center pin is typically crimped onto the center conductor of the coaxial cable on which the male BNC-style connector is mounted. The male BNC-style connector may also include a pair of arcuate grooves in the housing thereof that are configured to receive respective bayonet connector pins on a mating BNC-style female connector port. The arcuate grooves and bayonet connector pins act as a locking mechanism that allows an installer to lock the male BNC-style connector onto the female BNC-style connector port.

F-style coaxial connectors are used in both indoor and outdoor applications. A number of different types of F-style coaxial connector designs are known, including, but not limited to, crimped connectors, swaged connectors, and connectors which secure the cable into the connector with compression-style cable retention elements. F-style coaxial connectors connect to a female connector port via an internally-threaded nut that is provided on the front end of the male connector.

Coaxial cables and connectors are often used to carry signals to electronic devices, such as televisions, computers, modems, telephones, and the like. These devices can be susceptible to damage from power surges that may be carried over the coaxial cable. Surge protection devices may be placed between an electronic device that is to be protected and conductors, such as power outlets, cable termination points, antennas, and the like to divert or short voltage spikes to ground. Some surge protection devices, however, may lose their effectiveness over time due to, for example, the physical deterioration of surge protection conduction lines on a printed circuit board after shorting multiple voltage surges.

SUMMARY

According to some embodiments of the present invention, a coaxial connector comprises a surge protection component comprising a plurality of elongated members, a body portion that is configured to receive the surge protection component such that the elongated members extend along an outer surface thereof, and a center conductor disposed inside the body portion and spaced apart from the surge protection component so as to create a gap therebetween.

In other embodiments, the body portion comprises longitudinal slots formed thereon that receive the elongated members therein, respectively.

In still other embodiments, each of the plurality of elongated members has a first end portion thereof that is substantially perpendicular to the center conductor and a second end portion thereof that is substantially parallel with an outer surface of the body portion.

In still other embodiments, at least part of the body portion comprises an electrically insulative material.

In still other embodiments, the body portion comprises a slot formed therein and the surge protection component comprises a base portion that is configured for receipt in the slot formed in the body portion.

In still other embodiments, the plurality of elongated members comprises three elongated members spaced approximately 90° apart.

In further embodiments of the present invention, an apparatus comprises a surge protection component having a hole formed therein for receiving a center conductor of a female coaxial connector port therethrough and having an elongated member extending therefrom configured to engage a metallic structure that houses the female coaxial connector port. Edges of the hole formed in the surge protection component are spaced apart from the center conductor so as to create a gap therebetween.

In still further embodiments, the coaxial connector port comprises resilient clips that secure the surge protection component to the coaxial connector port.

In other embodiments of the present invention, an electrical power surge protection component comprises an electrically insulative body and first and second conductive wires encased in the electrically insulative body. The electrically insulative body comprises a void therein and the first and second conductive wires are spaced apart from each other to form a gap therebetween.

In still other embodiments, the electrically insulative body comprises epoxy and/or plastic.

In still other embodiments, the void is filled with air.

In still other embodiments, the void is filled with a gas other than air.

In still other embodiments, the first conductive wire has an end thereof formed in a cylindrical shape and an end of the second conductive wire is disposed in the cylinder.

In further embodiments of the present invention, an electrical power surge protection component comprises a printed circuit board, a conductive wire on the printed circuit board connected to an input terminal, and a ground post on the printed circuit board connected to a ground plane and spaced apart from the conductive wire so as to form a gap therebetween.

In still further embodiments, the gap between the conductive wire and the ground post comprises a horizontal gap and a vertical gap.

In other embodiments of the present invention, an electrical power surge protection component comprises a printed circuit board, a first conductive trace on the printed circuit board connected to an input terminal, and a second conductive trace on the printed circuit board connected to a ground plane interface and spaced apart from the first conductive trace so as to form a gap therebetween. Each of the first and second conductive traces has a metal layer formed thereon in a region where the first and second conductive traces overlap each other.

In still other embodiments of the present invention, the metal layer comprises solder.

In still other embodiments of the present invention, each of the metal layers disposed on the first and second conductive traces is disposed on the respective conductive trace so as to expose a portion of the respective conductive trace adjacent to the gap.

In still other embodiments of the present invention, each of the metal layers disposed on the first and second conductive traces substantially covers the respective conductive trace in its entirety.

In further embodiments of the present invention, an electrical power surge protection component comprises a printed circuit board, a first conductive wire on the printed circuit board connected to an input terminal, and a second conductive wire on the printed circuit board connected to a ground plane interface and spaced apart from the first conductive trace so as to form a gap therebetween.

In still further embodiments, the printed circuit board comprises first and second conductive traces disposed thereon, the first conductive trace being connected to the input terminal and the second conductive trace being connected to the ground plane interface and the first and second conductive wires have ends connected to the first and second conductive traces, respectively.

In other embodiments of the present invention, an electrical power surge protection component comprises a printed circuit board, a signal bearing conductor on the printed circuit board connected to an input terminal, and first and second conductors on the printed circuit board each connected to a ground plane. The signal bearing conductor is disposed between the first and second conductors so as to form a first gap with the first conductor and a second gap with the second conductor.

In still other embodiments, the first gap is approximately equal to the second gap.

In still other embodiments, the first gap is different than the second gap.

In still other embodiments, an overlap between the signal bearing conductor and the first conductor is equal to an overlap between the signal bearing conductor and the second conductor.

In still other embodiments, an overlap between the signal bearing conductor and the first conductor is different than an overlap between the signal bearing conductor and the second conductor.

In still other embodiments, outer surfaces of the signal bearing conductor, first conductor, and second conductor are substantially smooth.

In still other embodiments, outer surfaces of the signal bearing conductor, first conductor, and second conductor are irregular in shape.

In further embodiments of the present invention, an electrical power surge protection component comprises a printed circuit board, a capacitor on the printed circuit board having a first terminal connected to an input terminal and a second terminal, and a ground post on the printed circuit board connected to a ground plane. The second terminal is spaced apart from the ground post to form a gap therebetween.

DETAILED DESCRIPTION

The present invention is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

In accordance with some embodiments of the present invention, a female coaxial connector port can include a body portion that is configured to receive a surge protection component therein that has multiple elongated members extending along an outer surface of the body portion. A center conductor is disposed inside the body portion and is spaced apart from the surge protection component so as to create a gap therebetween. The body portion including the surge protection component is configured to be received in a metallic housing, which may have an externally threaded front end for forming a threaded connection with a male coaxial connector. The elongated members of the surge protection component make contact with an inner surface of the metallic housing when the body portion is received within the housing. The gap between the surge protection component and the center conductor at the point where the surge protection component and the center conductor are closest to each other is sized such that power surges cause arc currents to flow between the center conductor and the surge protection component, thereby diverting the power surge to the grounded metallic housing of the female coaxial connector port.

In accordance with other embodiments, a surge protection component can be disposed at a rear end of the female coaxial connector port and may have a hole that receives the center conductor therethrough. The edge or edges of the hole may be spaced apart from the center conductor to create a gap therebetween. The surge protection component may include an elongated member that is configured to engage a metallic structure, such as, for example, a box that houses the connector port.

Various additional embodiments of female coaxial connector ports, methods of operating female coaxial connector ports, and methods of retrofitting a generally conventional female coaxial connector port to include a surge protection component are described below according to embodiments of the present invention.

Figure 2A:
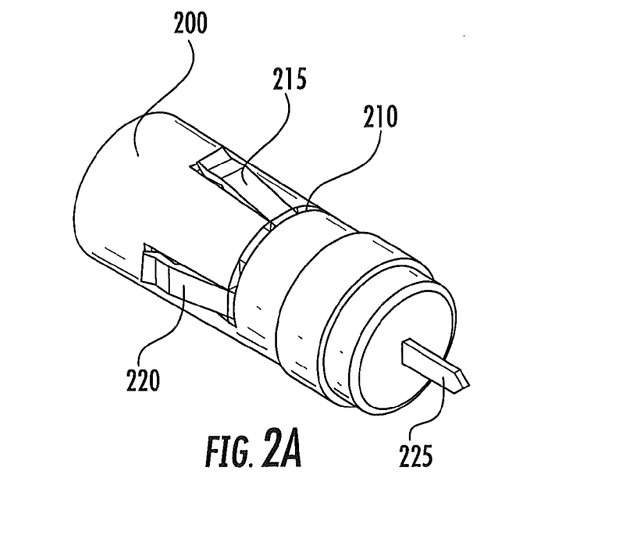
FIG. 2A is a perspective view of a body portion of a female coaxial connector port in accordance with some embodiments of the present invention.

FIG. 2A is a perspective view of a body portion of a female coaxial connector port in accordance with some embodiments of the present invention. As shown in FIG. 2, the body portion 200 includes a transverse slot formed therein to receive a surge protection component 210. The surge protection component 210 includes elongated members 215, 220, and 250 (member 250 is not visible in FIG. 2A) that extend along an outer surface of the body portion 200. The body portion 200 includes slots formed in the outer surface for receiving the elongated members 215, 220, and 250. The longitudinal slots in the body portion 200 and the elongated members 215, 220, and 250 received therein may be used to keep the surge protection component 210 in a relatively fixed position so that the body portion 200 and surge protection component 210 do not rotate with respect to each other. A center conductor 225 is disposed inside the body portion 200 and extends outside a rear end of the body portion.

Figure 2B:
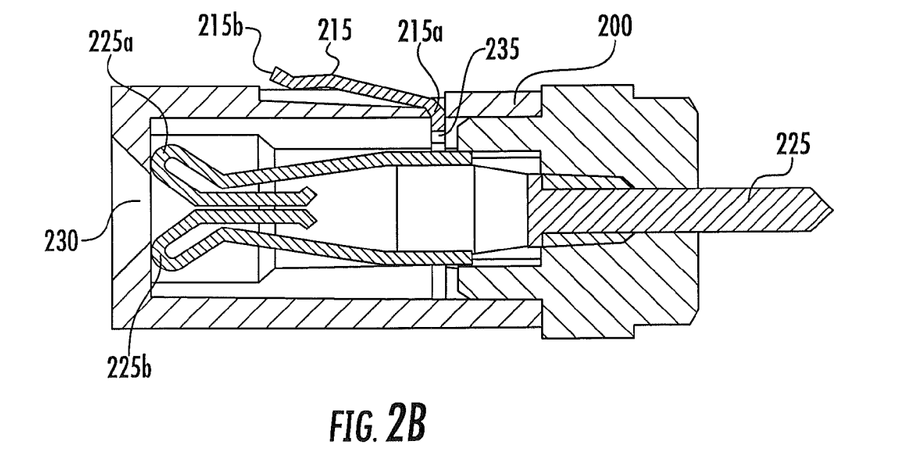
FIG. 2B is a longitudinal section view of the body portion of the female coaxial connector port of FIG. 2A.

FIG. 2B is a longitudinal section view of the body portion 200 of the female coaxial connector port of FIG. 2A. The body portion 200 includes an opening 230 at a front end thereof that is configured to receive a center conductor of a mating male coaxial connector. The center conductor of the mating male coaxial connector forms an electrical connection with the center conductor 225 by engaging the two prongs 225a and 225b of the center conductor 225. In some embodiments, the two prongs 225a and 225b are biased to spring inward so that the center conductor of the male coaxial connector port fits snugly between the two prongs 225a and 225b. As shown in FIG. 2B, the elongated member 215 is bent at an angle so that one end 215a proximate to the prong 225a is generally perpendicular to the prong 225a with the remaining portion of the elongated member 215 generally extending parallel with the outer surface of the body portion 200 along the corresponding longitudinal slot formed therein. End 215a of the elongated member 215 is spaced apart from the prong 225a to form a gap 235 therebetween. Power surges carried by the center conductor 225 can create an arc current between the prong 225a and the end 215a of the elongated member 215 to divert the power surge to a metallic housing via the elongated member 215. Although not shown, a metallic housing has a cavity therein that is configured to receive the body portion 200. The metallic housing may be formed, for example, of brass, zinc, aluminum, or other metals or metal alloys, with or without plating. The body portion 200 may be inserted into the metallic housing with the rear end being inserted first. The body portion 200 and the metallic housing are sized such that when the body portion 200 is inserted into the metallic housing, the elongated member 215 is compressed into the longitudinal slot formed in the body portion 200. The end 215b or the elongated member 215, however, is configured so as to create contact points with the metallic housing when the elongated member 215 is compressed into the slot formed in the body portion 200. Due to the angle of the bend in the elongated member 215 near end 215a, which causes the elongated member to extend generally along the outer surface of the body portion 200, the majority of the compressive force from the metallic housing is transmitted towards end 215b of the elongated member 215 rather than the end 215a. This may reduce the likelihood that the spacing of the gap 235 is altered when the body portion 200 is inserted into the metallic housing. The end 215b may also help to hold the body portion 200 into the metallic housing and reduce the likelihood that the body portion 200 backs out of the metallic housing. In accordance with various embodiments, the body portion 200 may be inserted into the housing from the back or the front with the elongated members 215, 220, and 250 oriented appropriately to facilitate receipt of the body portion 200 into the metallic housing. Embodiments of the elongated member 215 have been described in detail above. In accordance with various embodiments of the present invention, elongated members 220 and 250 may be configured in the same manner as elongated member 215 or may be configured differently.

Figure 3:
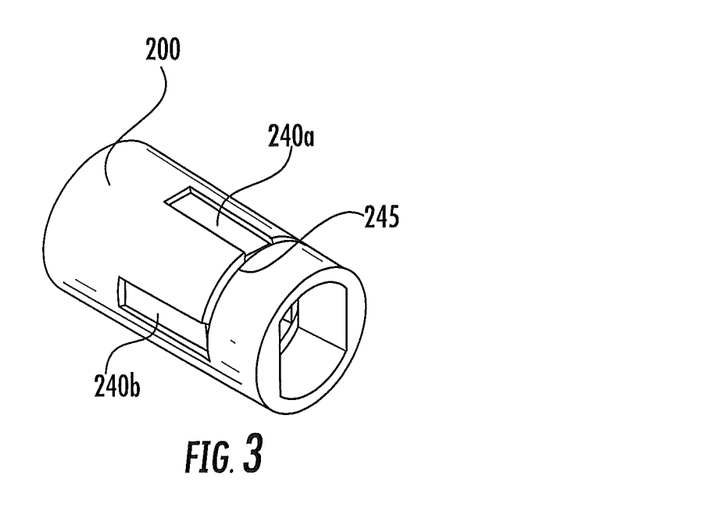
FIG. 3 is a perspective view of the body portion of the female coaxial connector port of FIG. 2A with a surge protection component thereof removed.

FIG. 3 is a perspective view of the body portion 200 without the surge protection component 210. The body portion 200 includes longitudinal slots 240a and 240b (and a third longitudinal slot, which is not visible in FIG. 3) for receiving elongated members comprising part of the surge protection component 210 and a transverse slot 245 around a portion of the circumference of the body portion 200 for receiving a base portion of the surge protection component 210. The body portion 200 may be formed of, for example, plastic or other malleable material. At least part of the body portion 200 is formed of an electrically insulative material. In some embodiments, the slots 240a and 240b may be omitted and the outer surface of the body portion 200 machined so as to accommodate the elongated members of the surge protection component 210. In such embodiments, other mechanisms may be used to keep the surge protection component 210 and body portion 200 from rotating with respect to each other. In other embodiments, the longitudinal slots 240a and 240b may be located in an interior surface of the metallic housing.

In other embodiments, the surge protection component 210 may be configured to be disposed at the rear end of the body portion 200. In these embodiments, the slot 245 would typically be omitted. When the surge protection component 210 is disposed at the rear end of the body portion 200, the metallic housing may also engage the base portion of the surge protection component 210 to provide additional contact surface area for diverting energy from a power surge.

Figure 4:
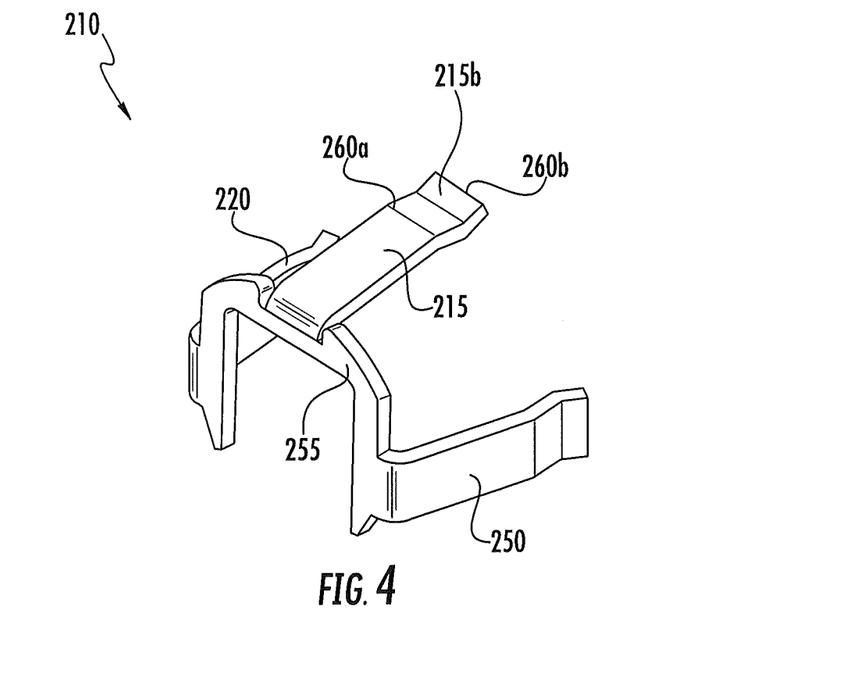
FIG. 4 is a perspective view of a surge protection component according to some embodiments of the present invention.

FIG. 4 is a perspective view of the surge protection component 210 according to some embodiments of the present invention. The surge protection component includes a base portion 255, which is configured for receipt in the slot 245 in the body portion 200 of the female coaxial connector port shown in FIG. 3. The surge protection component 210 includes three elongated members 215, 220, and 250 that are spaced approximately 90° apart. As described above with respect to FIG. 2B, the end 215b of the elongated member 215 is configured so as to provide contact points with a metallic housing when the metallic housing compresses the elongated member into the slot 240a of the body portion 200 shown in FIG. 3. These contact points 260a and 260b at the end 215b of the elongated member 215 are illustrated in FIG. 4. Elongated members 220 and 250 may be configured to have similar contact points. Although three elongated members 215, 220, and 250 are shown in FIG. 4, it will be understood that fewer or additional elongated members may be used in accordance with various embodiments of the present invention. The use of multiple elongated members to implement multiple spark gaps with respect to the center conductor 225 may provide improved power diversion to the metallic housing when a power surge occurs.

In other embodiments, the elongated members 215, 220, and 250 may be omitted and the base portion 255 of the surge protection component 210 may include portions thereon where an arc current can flow to the housing in response to a power surge.

Figure 5:
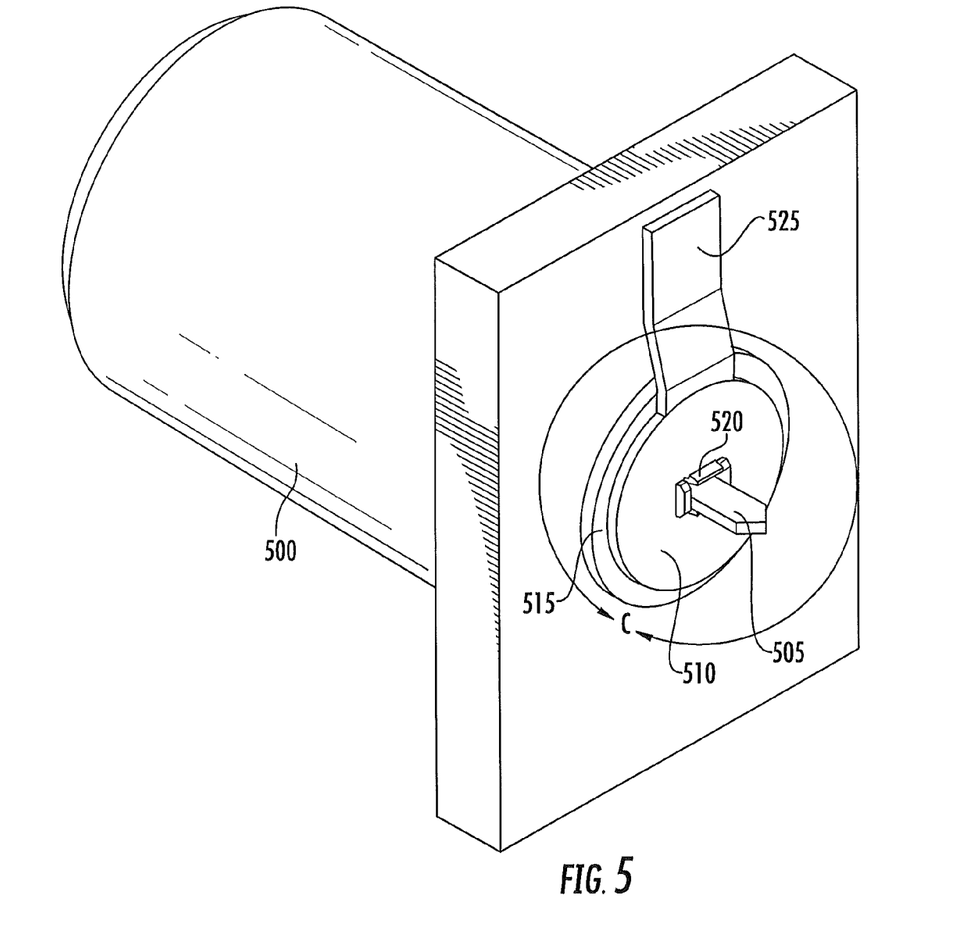
FIG. 5 is a perspective view of a surge protection component that can be retrofitted onto a female coaxial connector port in accordance with some embodiments of the present invention.

FIG. 5 is a perspective view of a surge protection component that can be retrofitted onto a female coaxial connector port in accordance with some embodiments of the present invention. The female coaxial connector port 500 is shown as being installed on a wall with a center conductor 505 extending from the rear end 515 of the female coaxial connector port 500. A surge protection component 510 is disposed on the rear end 515 of the female coaxial connector port 500 and is configured to receive the center conductor 505 therethrough. The surge protection component 510 may be attached to the rear end 515 of the female coaxial connector port 500 using various techniques. In the example shown in FIG. 5, resilient clips 520 are used to hook over the edge of the opening through which the center conductor 505 is received to hold the surge protection component 510 in place. The surge protection component 510 further includes an elongated member 525 that abuts or attaches to a metallic surface, such as the wall carrying the female coaxial connector port 500, using, for example, a soldered, welded, or a press fit connection. One or more spark gaps are formed between the center conductor 505 and the edges of the opening in the surge protection component 510 through which the center conductor 505 is received. Similar to the embodiments described above, power surges carried along the center conductor 505 may be diverted through the surge protection component 510 to, for example, the metallic structure of the wall. The surge protection retrofit configuration illustrated in FIG. 5 may allow a generally conventional female coaxial connector port to include surge protection functionality without requiring substantial modifications to the female coaxial connector port.

Figure 6:
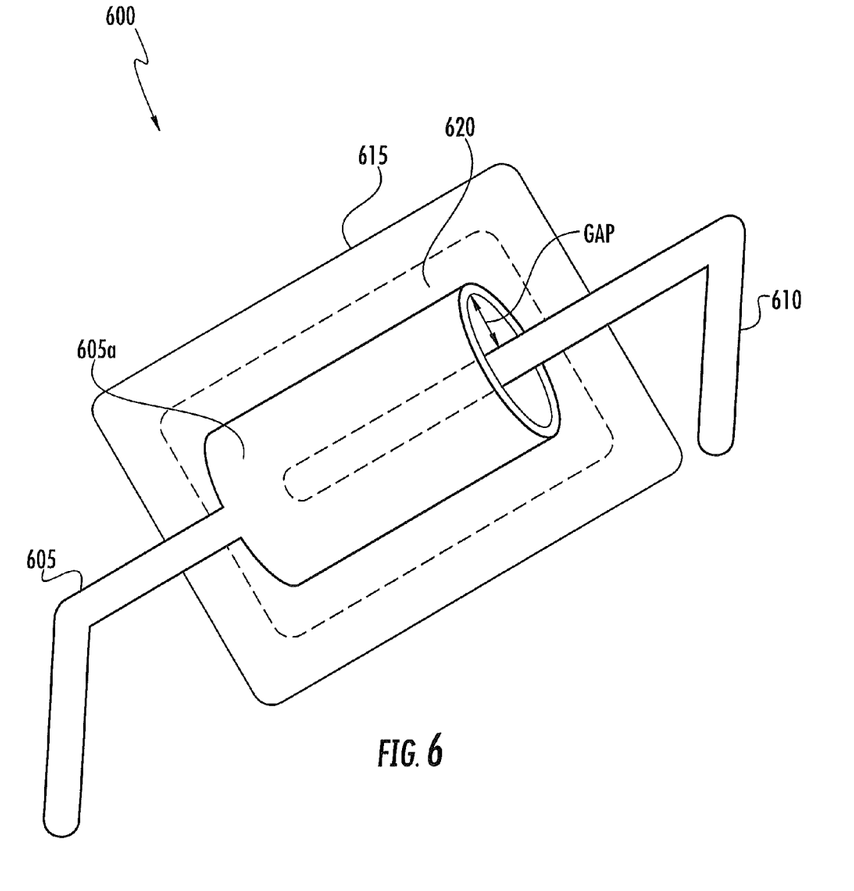
FIGS. 6 and 7 are perspective, sectional views of surge protection components in which spaced apart conductors are encased in a body according to some embodiments of the present invention.

FIG. 6 is a diagram of a surge protection component 600 that uses a spark gap to protect against power surges and can be included in various types of electronic devices according to some embodiments of the present invention. The surge protection component 600 comprises two conductive wires 605 and 610 that are encased in an electrically insulative body 615 as shown. The electrically insulative body 615 may be formed of an epoxy, plastic, or other suitable insulator. The electrically insulative body 615 includes a void 620 that is filled with air or some other type of gas. The conductive wire 605 includes an end 605a that is configured in a generally cylindrical shape in the void region 620 of the body 615 so as to be able to receive an end 610a of the other conductive wire 610 therein. The wire end 610a is disposed generally in the middle of the wire end 605a so that the radial spacing from the wire end 610a to the cylindrical wire end 605a is approximately the same around the circumference of the cylindrical wire end 605a. This gap between the wire ends 605a and 610a may serve as a spark gap to conduct current between wires 605 and 610 under power surge conditions. The type of gas used in the void 620 may be selected based on its propensity to facilitate a spark between the wire ends 605a and 610a.

Figure 7:
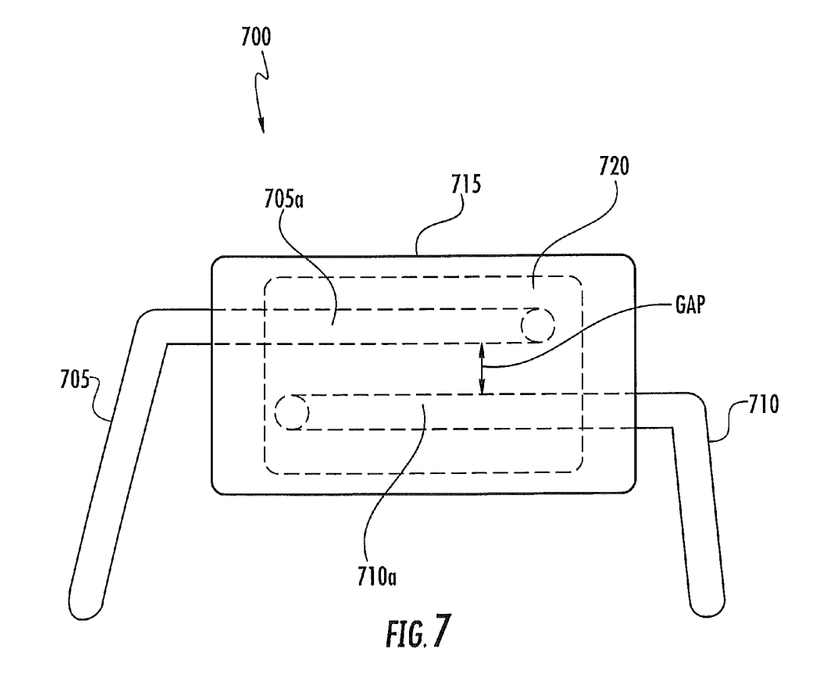

FIG. 7 is a diagram of a surge protection component 700 that uses a spark gap to protect against power surges and can be included in various types of electronic devices according to some embodiments of the present invention. The surge protection component 700 comprises two conductive wires 705 and 710 that are encased in an electrically insulative body 715 as shown. The electrically insulative body 715 may be formed of an epoxy, plastic, or other suitable insulator. The electrically insulative body 715 includes a void 720 that is filled with air or some other type of gas. The conductive wire 705 includes an end 705a that extends into the void region 720 of the body 715 and the conductive wire 710 includes an end 710a that extends into the void region 720 of the body 715 so that the two ends 705a and 710a overlap each other in a spaced apart configuration. This spacing or gap between the wire ends 705a and 710a may serve as a spark gap to conduct current between wires 705 and 710 under power surge conditions. The type of gas used in the void 720 may be selected based on its propensity to facilitate a spark between the wire ends 705a and 710a.

Figure 8:
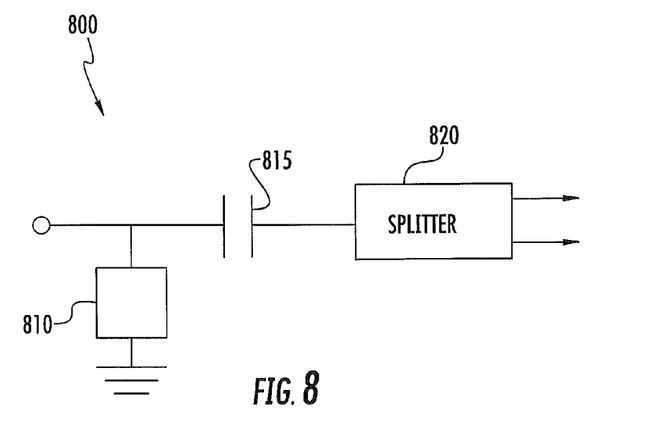
FIG. 8 is a circuit diagram of a coaxial cable circuit including a surge protection component according to some embodiments of the present invention.

Male F-style coaxial connectors are used to mechanically and electrically attach a coaxial cable to a female connector port. Connector boxes adapted to have a coaxial antenna lead-in cable as well as the coaxial or other type of cables for several receivers interconnected therewithin are already known and are conventionally referred to as "splitters" or "splitter boxes." Within such splitters, the individual conductors of the several cables are generally interconnected through electronic circuit components of one type or another. FIG. 8 is a circuit diagram of a coaxial cable circuit 800 including a surge protection component 810 according to some embodiments of the present invention. The coaxial cable circuit 800 comprises a capacitor 815 coupled in series to a splitter 820. The surge protection component 810 is connected between an input terminal node and ground. The input terminal node may be connected to a coaxial antenna lead-in cable, for example.

Figure 9:
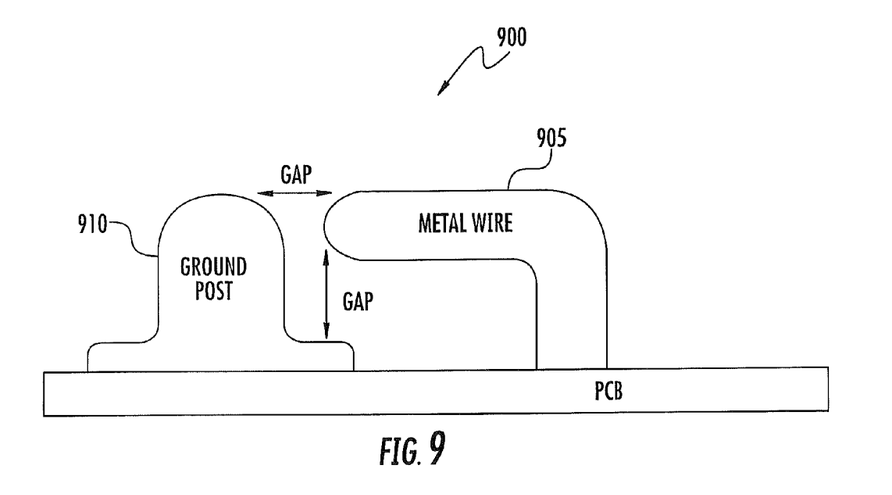
FIGS. 9-14 are perspective views of the surge protection component of FIG. 8 according to some embodiments of the present invention.

FIG. 9 is a diagram of the surge protection component 810 of FIG. 8 according to some embodiments of the present invention. As shown in FIG. 9, the surge protection component 900 includes a conductive metal wire 905 disposed on a printed circuit board (PCB) so as to be spaced apart from a ground post 910, which is connected to a ground plane, for example. Based on the geometric configuration of the metal wire 905 and the ground post 910, spark gaps of may be formed in multiple directions. For example, a vertical spark gap may be formed to have a first distance while a horizontal spark gap may be formed to have a second distance. The first and second distances may be the same or different in accordance with various embodiments of the present invention. Current may be conducted across one or both of the gaps depending on the magnitude of the power surge and shunted to ground through the surge protection component 900. The overlap between ground post 910 and the metal wire 905 along with the width of the gap(s) between the ground post 910 and metal wire 905 may vary depending on the magnitude of power surge the surge protection component is configured to handle.

Figure 10:
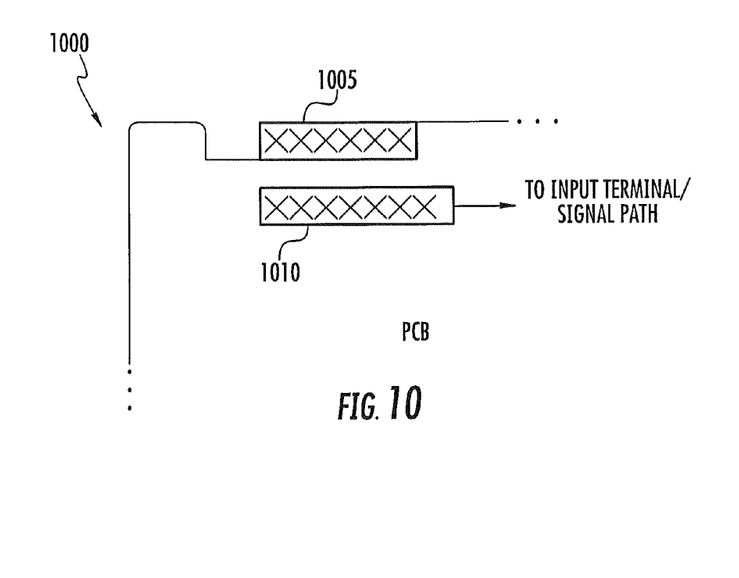

FIG. 10 is a diagram of the surge protection component 810 of FIG. 8 according to further embodiments of the present invention. As shown in FIG. 10, the surge protection component 1000 includes copper trace lines 1005 and 1010 disposed on a PCB and having solder or other metal formed thereon to provide structural strength. The trace lines 1005 and 1010 are spaced apart to form a gap therebetween. Current may be conducted across the gap when there is a surge in power that is received via a signal through the trace line 1010. The trace line 1005 is disposed adjacent to a cut out opening in the PCB for a ground post so as to allow current from the power surge to jump the gap between the trace lines 1005 and 1010 and be shunted to ground via a ground post disposed in the ground post opening in the PCB and abutting the trace line 1005. In addition, the length of overlap between the trace lines 1005 and 1010 along with the width of the spark gap may vary depending on the magnitude of power surge the surge protection component is configured to handle. The solder or other metal disposed on the trace lines 1005 and 1010 may provide sufficient physical strength to carry current from power surges, which may be as high as 3000 amps at 6000 volts. Without the structural reinforcement of the solder or metal, the conventional PCB copper trace may be damaged under such high power conditions.

Figure 11:
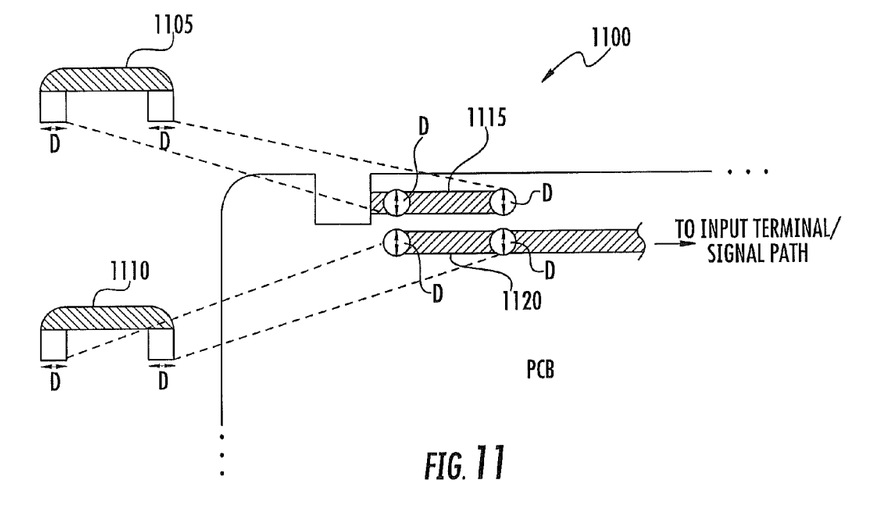

FIG. 11 is a diagram of the surge protection component 810 of FIG. 8 according to further embodiments of the present invention. As shown in FIG. 11, the surge protection component 1100 includes conductive metal wires 1105 and 1110 disposed on a PCB and having endpoints affixed, e.g., soldered at points along copper trace lines 1115 and 1120, respectively, on a PCB. Holes in the PCB may be configured to have a diameter approximately the same as the diameters of the conductive metal wires 1105 and 1110 to facilitate securing the metal wires 1105 and 1120 to the PCB. The metal wires 1105 and 1110 are spaced apart to form a gap therebetween. Current may be conducted across the gap when there is a surge in power that is received via a signal through the metal wire 1110. The metal wire 1105 is disposed adjacent to a cut out opening in the PCB for a ground post so allow current from the power surge to jump the gap between the metal wires 1105 and 1110 and be shunted to ground via a ground post disposed in the ground post opening in the PCB and abutting the trace line 1115. In addition, the length of overlap between the metal wires 1105 and 1110 along with the width of the spark gap may vary depending on the magnitude of power surge the surge protection component is configured to handle.

Figure 12:
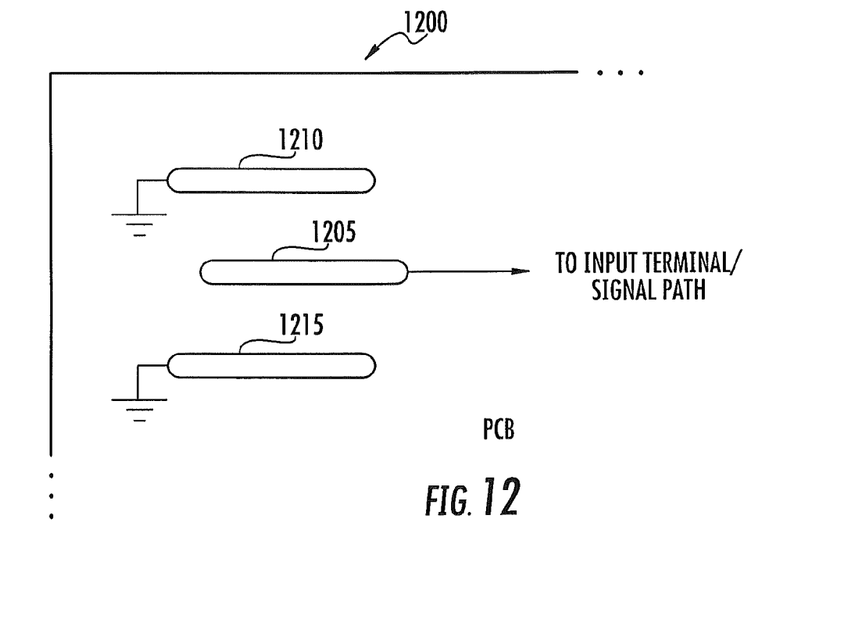

FIG. 12 is a diagram of the surge protection component 810 of FIG. 8 according to further embodiments of the present invention. As shown in FIG. 12, the surge protection component 1200 includes a signal bearing conductor 1205 disposed between two conductors 1210 and 1215. In accordance with various embodiments of the present invention, the spacing between the signal bearing conductor 1205 and conductor 1210 and the spacing between the signal bearing conductor 1205 and the conductor 1215 may be the same or different. In addition, the length of overlap between the signal bearing conductor 1205 and conductor 1210 and the length of overlap between the signal bearing conductor 1205 and the conductor 1215 may be the same or different. Current may be conducted across the gap between the conductor 1205 and the conductor 1210 and/or 1215. Conductors 1210 and 1215 are connected to ground allowing current from power surges on the signal bearing conductor 1205 to be shunted to ground. In addition, the length of overlap between the signal bearing conductor 1205 and the conductors 1210 and 1215 along with the width of the spark gaps may vary depending on the magnitude of power surge the surge protection component is configured to handle.

Figure 13:
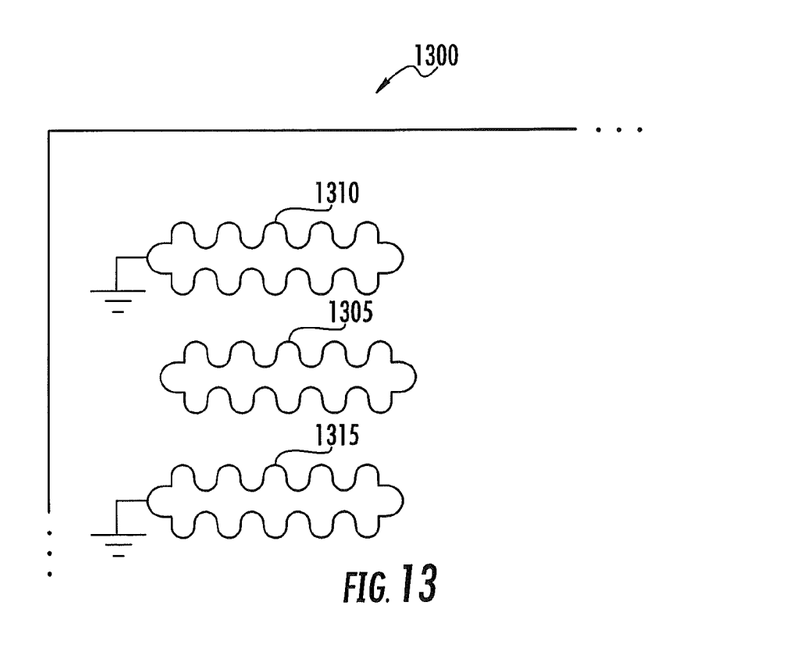

FIG. 13 is a diagram of the surge protection component 810 of FIG. 8 according to further embodiments of the present invention. As shown in FIG. 13, the surge protection component 1300 includes a signal bearing conductor 1305 is disposed between two conductors 1310 and 1315. In accordance with various embodiments of the present invention, the spacing between the signal bearing conductor 1305 and conductor 1310 and the spacing between the signal bearing conductor 1305 and the conductor 1315 may be the same or different. In addition, the length of overlap between the signal bearing conductor 1305 and conductor 1310 and the length of overlap between the signal bearing conductor 1305 and the conductor 1315 may be the same or different. Current may be conducted across the gap between the conductor 1305 and the conductor 1310 and/or 1320. Conductors 1310 and 1315 are connected to ground allowing current from power surges on the signal bearing conductor 1305 to be shunted to ground. The embodiment of FIG. 13 is similar to the embodiment of FIG. 12 with the exception of the shape of the conductors 1305, 1310, and 1315. As can be seen in FIG. 13, the conductors 1305, 1310, and 1315 have an outer surface with an irregular shape such that the surface area is increased as compared to the generally smooth or planar surfaces of the conductors 1205, 1210, and 1215 of FIG. 12. In addition, the length of overlap between the signal bearing conductor 1305 and the conductors 1310 and 1315 along with the width of the spark gaps may vary depending on the magnitude of power surge the surge protection component is configured to handle.

Figure 14:
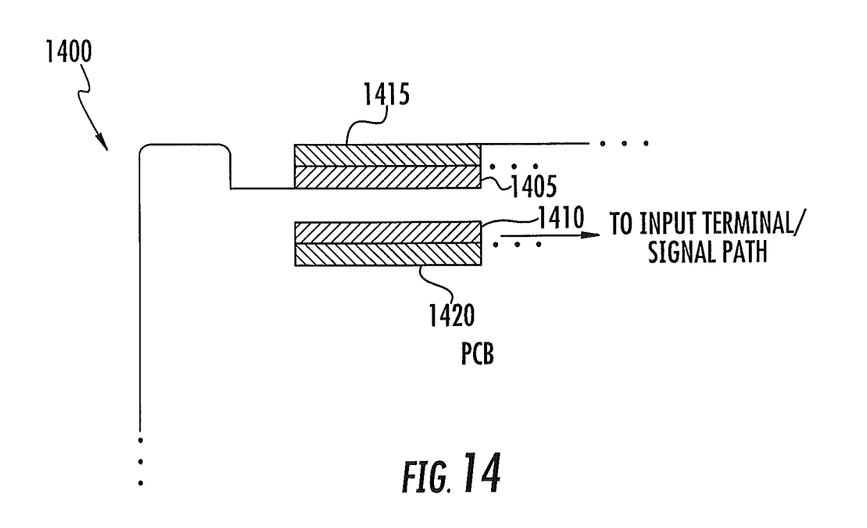

FIG. 14 is a diagram of the surge protection component 810 of FIG. 8 according to further embodiments of the present invention. As shown in FIG. 14, the surge protection component 1400 includes copper trace lines 1405 and 1410 disposed on a PCB. The trace lines 1405 and 1410 are spaced apart to form a gap therebetween. Current may be conducted across the gap when there is a surge in power that is received via a signal through the trace line 1410. The trace line 1405 is disposed adjacent to a cut out opening in the PCB for a ground post or otherwise connected to a ground plane so as to allow current from the power surge to jump the gap between the trace lines 1405 and 1410 and be shunted to ground. In contrast to the embodiment of FIG. 10, the trace lines 1405 and 1410 do not have solder or a metal disposed thereon that covers substantially the entirety of the trace lines to provide structural strength, but instead have solder or metal masks 1415 and 1420 that cover portions of the trace lines 1405 and 1410, respectively, away from the gap to help maintain the trace lines 1405 and 1410 in place on the PCB when handling a power surge. In some embodiments, the trace lines 1405 and 1410 may be formed to be thicker than conventional two-ounce trace lines used in PCBs. In addition, the length of overlap between the trace lines 1405 and 1410 and the width of the spark gap may vary depending on the magnitude of power surge the surge protection component is configured to handle.

Figure 15:
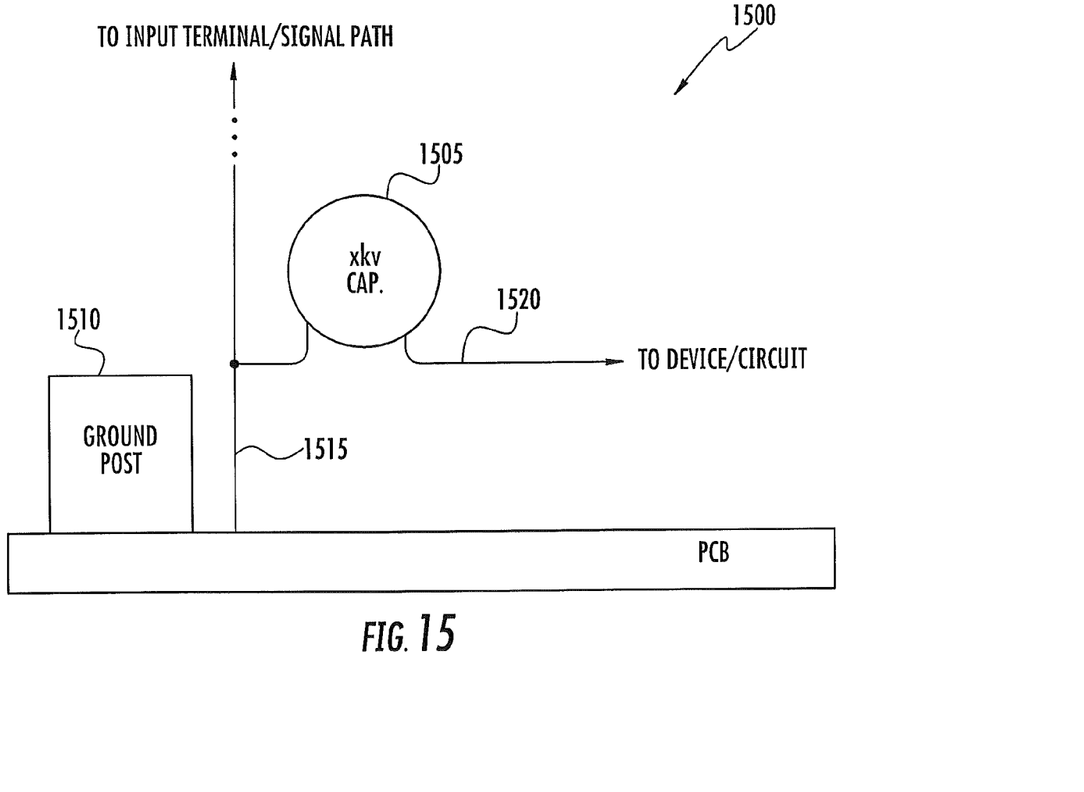
FIG. 15 is a circuit diagram of a surge protection component according to some embodiments of the present invention.

FIG. 15 is a diagram of a surge protection component according to further embodiments of the present invention. As shown in FIG. 15, the surge protection component 1500 includes a high voltage capacitor 1505, such as the capacitor 815 of FIG. 8, with one terminal 1515 configured so as to be spaced apart from a ground post 1510, which is connected to a ground plane, for example. A spark gap is formed between the terminal of the capacitor 1505 and the ground post to allow current to be conducted across the gap and shunted to ground in response to a power surge. The length of overlap between the capacitor terminal 1515 and the ground post along with the width of the spark gap may vary depending on the magnitude of power surge the surge protection component is configured to handle. The other capacitor terminal 1520 may be connected to a splitter, such as the splitter 820 of FIG. 8.

Thus, as described above, in accordance with some embodiments of the present invention, a female coaxial connector port may include a surge protection component that can provide multiple spark gaps for diverting power surges to, for example, the housing of the connector port. Such connector ports may be used to provide surge protection for power surges originating from the network or in the facility in which the connector port is installed. The multiple spark gaps used for diverting power surges may be more effective at shunting the excess power to ground than using a single spark gap. As the surge protection component can be installed on the plastic inner body portion of the coaxial connector port, the machining operations required to accommodate the surge protection component may be relatively minor. In other embodiments, a generally conventional female coaxial connector port may be retrofitted to include a surge protection component that affixes at a rear end thereof. The surge protection component may receive a central conductor therethrough such that one or more spark gaps are formed with edges of the opening. The surge protection component includes an elongated member to abut or attach to a conducting object, such as a metallic wall, to divert power surges to ground.

In accordance with further embodiments of the present invention, conductors can be encased in an epoxy or plastic, for example, that includes a void inside the epoxy or plastic body where the conductors can be spaced apart for form a spark gap. In this way, a portable surge protection component similar to a resistor may be provided and used in a variety of surge protection circuits and applications. In other embodiments, a PCB can be configured so as to place conductors adjacent to one another such that a gap is formed therebetween that can function as a spark gap under power surge conditions allowing current from the power surge to be diverted to a ground plane. The conductors may be electrical trace lines, electrical trace lines reinforced with a metallic layer, such as solder, for example, wires disposed on the electrical trace lines or other types of conductive lines that are positioned proximate to each other to form the desired gap. In general, the spark gap described herein is formed by positioning conductive elements next to each other in a way that facilitates the formation of a spark to divert current from a power surge to ground or some other electrical circuit while so as to avoid damage to other circuit elements.

The embodiments of the surge protection components described herein can be used in various types of devices including, but not limited to, a coaxial connector port, a signal amplifier device, and a signal splitter device.

In the drawings, the size of lines and elements may be exaggerated for clarity. It will also be understood that when an element is referred to as being "coupled" to another element, it can be coupled directly to the other element, or intervening elements may also be present. In contrast, when an element is referred to as being "directly coupled" to another element, there are no intervening elements present. Likewise, it will be understood that when an element is referred to as being "connected" or "attached" to another element, it can be directly connected or attached to the other element or intervening elements may also be present. In contrast, when an element is referred to as being "directly connected" or "directly attached" to another element, there are no intervening elements present.

This invention is directed to coaxial connectors. As used herein, the term "longitudinal" and derivatives thereof refer to the direction defined by the central axis of the coaxial connector, which is generally coexistent with the central axis of any coaxial cable that the coaxial connector is installed on when the coaxial cable is fully extended in a straight line. The term "transverse" and derivatives thereof refer to the plane that is normal to the longitudinal direction. Herein, the terms "front," "front end," and derivatives thereof when used with respect to a female coaxial connector port refer to the end of the female coaxial connector port that mates with a male coaxial connector. Thus, the "front" or "front end" of a female coaxial connector port refers to the end of the connector port that receives a protruding center conductor from a male coaxial connector. Likewise, references herein to the "rear" or "rear end" of a female coaxial connector port refer to the end of the coaxial connector that is opposite the front end.

Unless otherwise defined, all technical and scientific terms used herein have the same meaning as commonly understood by one of ordinary skill in the art to which this invention belongs. The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. As used herein, the term "and/or" includes any and all combinations of one or more of the associated listed items.

In the drawings and specification, there have been disclosed exemplary embodiments of the invention. Although specific terms are used, they are used in a generic and descriptive sense only and not for purposes of limitation, the scope of the invention being defined by the following claims.

That which is claimed:

1. An electrical power surge protection component, comprising:
   a printed circuit board;
   a first conductive wire having first and second ends disposed on the printed circuit board and being connected to an input terminal; and
   a second conductive wire having first and second ends disposed on the printed circuit board and being connected to a ground plane interface;
   wherein the first and second conductive wires are spaced apart from each other so as to form a gap region of overlap therebetween that is configured to allow an electrical spark to pass between the first and second conductive wires, a length of the gap region of overlap being defined based on a positioning of the first and second ends of the first conductive wire and the positioning of the first and second ends of the second conductive wire on the printed circuit board.

2. The electrical power surge protection component of claim 1, wherein the printed circuit board comprises first and second conductive traces disposed thereon, the first conductive trace being connected to the input terminal and the second conductive trace being connected to the ground plane interface; and
   wherein the first and second ends of the first conductive wire are connected to the first conductive trace and the first and second ends of the second conductive wire are connected to the second conductive trace.

3. The electrical power surge protection component of claim 2, wherein the printed circuit board further comprises a cut out opening that is configured to receive a ground post.

4. The electrical power surge protection component of claim 3, wherein the cut out opening is disposed adjacent the second conductive trace and is further configured to receive the ground post such that the ground post makes an electrical connection with the second conductive trace.

5. The electrical surge protection component of claim 1, wherein the printed circuit board is disposed in a coaxial connector port.

6. The electrical surge protection component of claim 1, wherein the printed circuit board is disposed in a signal amplifier device.

7. The electrical surge protection component of claim 1, wherein the printed circuit board is disposed in a signal splitter device.

* * * * *